(12) United States Patent
Rezanezhad Gatabi

(10) Patent No.: US 9,406,758 B2
(45) Date of Patent: Aug. 2, 2016

(54) SEMICONDUCTOR DEVICES WITH SHARP GATE EDGES AND METHODS TO FABRICATE SAME

(71) Applicant: Iman Rezanezhad Gatabi, Sunnyvale, CA (US)

(72) Inventor: Iman Rezanezhad Gatabi, Sunnyvale, CA (US)

(73) Assignee: IMAN REZANEZHAD GATABI, San Jose, CA (US)

( * ) Notice: Subject to any disclaimer, the term of this patent is extended or adjusted under 35 U.S.C. 154(b) by 0 days.

(21) Appl. No.: 14/738,906

(22) Filed: Jun. 14, 2015

(65) Prior Publication Data

US 2015/0340237 A1 Nov. 26, 2015

Related U.S. Application Data

(62) Division of application No. 14/327,559, filed on Jul. 9, 2014, now Pat. No. 9,166,006.

(60) Provisional application No. 61/913,381, filed on Dec. 8, 2013.

(51) Int. Cl.
| | | |
|---|---|---|
| H01L 29/00 | (2006.01) |
| H01L 21/00 | (2006.01) |
| H01L 29/20 | (2006.01) |
| H01L 29/778 | (2006.01) |
| H01L 29/423 | (2006.01) |
| H01L 29/06 | (2006.01) |
| H01L 29/10 | (2006.01) |
| H01L 29/15 | (2006.01) |
| H01L 29/8605 | (2006.01) |
| H01L 29/872 | (2006.01) |
| H01L 29/205 | (2006.01) |
| H01L 29/66 | (2006.01) |
| H01L 21/285 | (2006.01) |
| H01L 29/417 | (2006.01) |

(52) U.S. Cl.
CPC ........ *H01L 29/2003* (2013.01); *H01L 29/0657* (2013.01); *H01L 29/1029* (2013.01); *H01L 29/155* (2013.01); *H01L 29/205* (2013.01); *H01L 29/423* (2013.01); *H01L 29/7786* (2013.01); *H01L 29/7787* (2013.01); *H01L 29/8605* (2013.01); *H01L 29/872* (2013.01); *H01L 21/28587* (2013.01); *H01L 29/41758* (2013.01); *H01L 29/66462* (2013.01)

(58) Field of Classification Search
CPC .............. H01L 29/845; H01L 21/0217; H01L 21/823431; H01L 29/2003; H01L 29/7787; H01L 29/8605; H01L 29/872; H01L 29/155; H01L 29/7786; H01L 29/423; H01L 29/0657; H01L 29/1029; H01L 29/205; H01L 29/66462; H01L 29/41758; H01L 21/28587; H01L 21/28282
See application file for complete search history.

(56) References Cited

U.S. PATENT DOCUMENTS

| | | | | |
|---|---|---|---|---|
| 7,374,996 B2* | 5/2008 | Kuo | ....................... | B82Y 10/00 257/E21.209 |
| 8,450,792 B2* | 5/2013 | Bajaj | ..................... | H01L 29/045 257/324 |

* cited by examiner

*Primary Examiner* — Nikolay Yushin

(57) ABSTRACT

This application discloses semiconductor devices with sharp gate edges including 2D and 3D memory cells, High Electron Mobility Transistors and tri-gate transistors. Implementation of a gate with sharp edges may improve the read and write speed and reduce the program and erase voltages in memory cells. It may also improve the gate control over the channel in tri-gate transistors and HEMTs. Methods to fabricate such devices are also disclosed.

21 Claims, 14 Drawing Sheets

- Prior Art -

- Prior Art -

- Prior Art -

- Prior Art -

SEMICONDUCTOR DEVICES WITH SHARP GATE EDGES AND METHODS TO FABRICATE SAME

CROSS-REFERENCE TO RELATED APPLICATIONS

This application is a divisional application of U.S. non-provisional application Ser. No. 14/327,559 filed on Jul. 9, 2014 which claims the benefits of U.S. provisional application Ser. No. 61/913,381, filed on Dec. 8, 2013.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

BACKGROUND OF THE INVENTION

Memory devices, HEMTs and FinFETs are key components in today's semiconductor industry. Improving the characteristics of these devices is critical to enhance their performance. One of the issues of memory cells is the relatively high read and write voltages needed to program and erase the cell. This issue becomes more critical if a high-k dielectric were used in the gate charge trapping structure. These relatively large voltages are required so that the charges in the channel can overcome the dielectric barrier and tunnel into the charge trapping region under the gate and vise versa. Moreover, in FinFETs, HEMTs and Tri-gate transistors, for example, scaling down the transistor dimensions may decrease the gate control over the channel. Implementation of this invention may provide faster read and write speeds and lower read and write voltages for memory cells. It may also provide a better gate control over the channel in FinFETs, HEMTs and Tri-gate transistors

BRIEF SUMMARY OF THE INVENTION

It is generally known that the electric field is stronger near sharp edges of the biased conductors. If the gate of a memory cell is designed in a way such that at least one of its edges in contact with a dielectric has an angle of less than 88 degrees, a smaller gate voltage may be required to move charges from the channel into the charge trapping layer underneath the gate (and vise versa) which may improve the read and write speed. In addition, in FinFETs, HEMTs and Tri-Gate transistors, for example, if sharp gate edges were implemented, a smaller change in the gate bias may be required to accumulate the charge in the channel under the gate and turn ON the device.

DETAILED DESCRIPTION OF THE INVENTION

Different examples will be described in details that represent some example embodiments of the present invention. However the technical and structural descriptions presented herein are representative for the purposes of describing the present invention, the described invention may be embodied in many alternate forms and should not be limited to the example embodiments described herein.

The described examples can be modified in various alternative forms. For example, the thickness and dimensions of the regions in drawings may be exaggerated for clarity. There is no intention to limit the invention to the particular forms disclosed. However, examples are used to describe the invention and to cover some modifications and alternatives within the scopes of the present invention.

The spatially relative terms used here such as "underneath", "below" and "above" are for the ease of description and to show the relationship between an element and another one in the figures. If the device in the figure is turned over, elements described as "underneath" or "below" other elements would then be "above" other elements. Therefore, for example, the term "underneath" can represent an orientation which is below as well as above. If the device is rotated, the spatially relative terms used herein should be interpreted accordingly.

Unless otherwise stated, variations of the shapes of the figures as a result of, for example, manufacturing techniques and tolerances are expected. For instance, a doped rectangle region with a specified doping concentration in illustrations may have rounded or curved features or gradient at its edges rather than an abrupt change from a region to another region. Therefore, the regions illustrated in figures are schematic and their shapes do not necessarily show the actual shape of the fabricated device. Unless otherwise stated, there is no intention to limit the invention to the values (such as dimensions, bias voltages and doping concentrations) used to describe the example embodiments. These values are selected to describe the related characteristics for a better understanding of the present invention. Unless otherwise stated, the terms used herein have the same meaning as commonly understood by someone with ordinary skills in the invention field.

Throughout this document, the whole device structure in provided example embodiments may not be presented for the sake of simplicity. This can be understood by someone with ordinary expertise in the field of invention. For example, when showing a transistor, the gate spacers may not be depicted. In such cases, any new or well-known designs for the un-shown parts are expected. Therefore, it should be understood that the provided example embodiments may just have illustrations that are mainly intended to show the scope of the invention and different designs of other parts of the device are expected.

Figure 1:
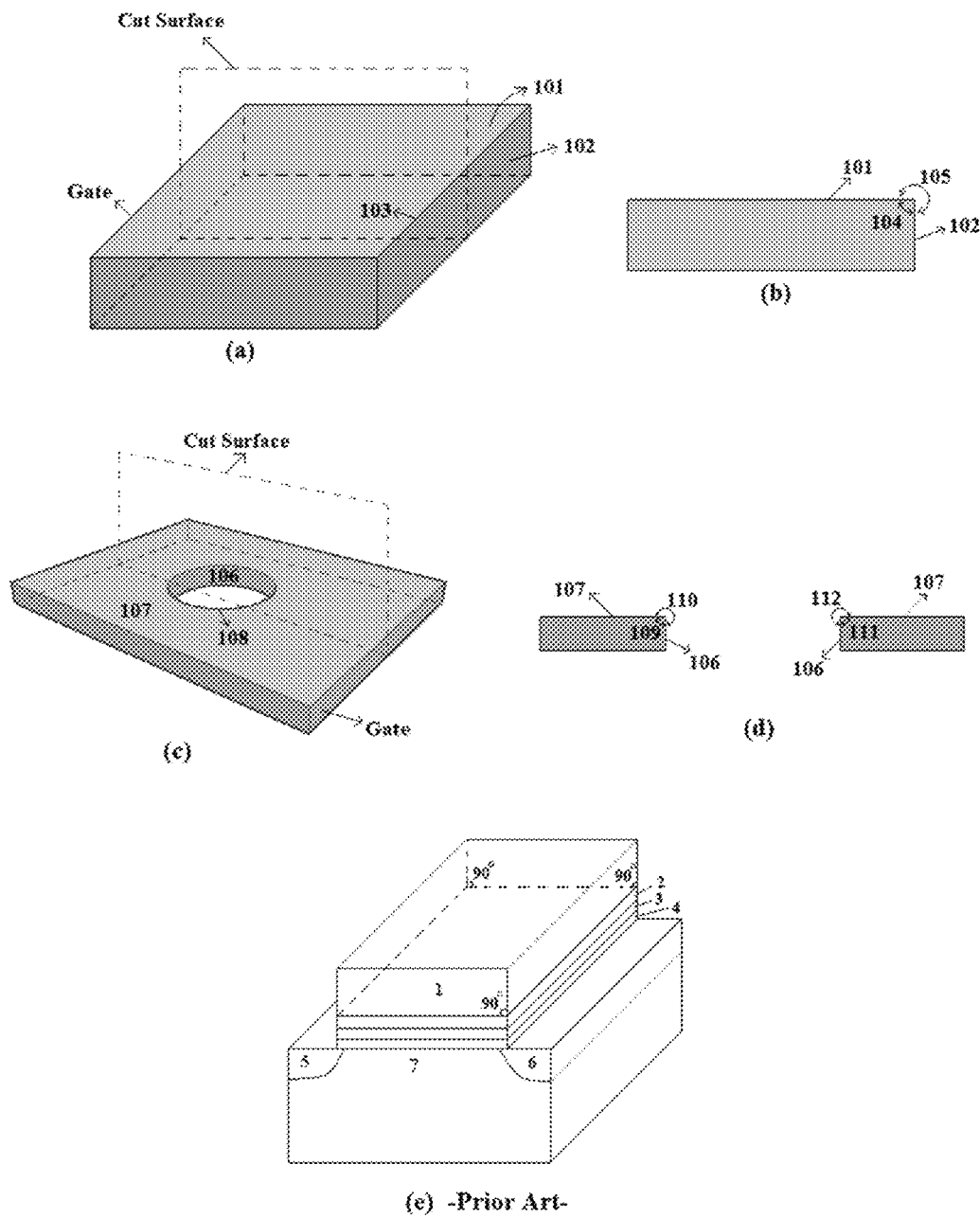
FIG. 1 shows sets of figures to define an "internal" gate angle and also a prior art wherein a typical planar memory cell with a floating gate is depicted.

Throughout this document, in claims and specification sections for example, it is referred to "internal" gate angles formed by two surfaces of the gate. Therefore, it is necessary to clarify the definition of an "internal" gate angle as opposed to an "external" gate angle. If the gate of a device is considered as a geometric solid, any two surfaces of the gate may form an "internal" gate angle which is inside the gate, or they may form an "external" gate angle which is outside the gate. FIG. 1.*a* shows an example of a rectangular prism gate with a top surface 101 and a right sidewall surface 102 that intersect each other in a gate edge 103. FIG. 1.*b* shows a cross-sectional view of the gate of FIG. 1.*a* at the shown cut surface. Surfaces 101 and 102 form an "internal" gate angle of 104 at the gate edge 103 which is inside the gate. Surfaces 101 and 102 also form an "external" gate angle of 105 at the gate edge 103 which is outside the gate. FIG. 1.*c* shows an example of a rectangular prism gate with a cylindrical hole having a top surface 107 and a surface 106. Surfaces 106 and 107 intersect each other in a circular gate edge 108. FIG. 1.*d* shows a cross-sectional view of the gate of FIG. 1.*c* at the shown cut surface. Surfaces 106 and 107 form an "internal" gate angle of 109 at the gate edge 108 which is inside the gate. Surfaces 106 and 107 also form an "external" gate angle of 110 at the gate edge 108 which is outside the gate volume. Surfaces 106 and 107 also form an "internal" gate angle of 111 at the gate edge 108 which is inside the gate. Surfaces 106 and 107 also form an "external" gate angle of 112 at the gate edge 108 which is outside the gate.

It is generally known that the electric field is stronger near the sharp edges of the biased conductors. If the gate of a memory cell is designed in a way such that at least one of its edges in contact with a dielectric has an angle less than 88 degrees, a smaller gate voltage may be required to move the charges from the channel into the charge trapping layer underneath the gate (and vise versa) which may improve the read and write speed. In addition, in FinFETs and Tri-Gate transistors, for example, if the sharp gate edges were implemented, a smaller change in the gate bias may be required to accumulate the charge in the channel under the gate and turn ON the device.

An example embodiment of this invention is a memory cell having a non-insulating channel region, said memory cell has a gate which is not in physical contact with the said channel region, wherein at least one dielectric material is implemented in an area between the said gate and the said channel region, wherein at least two surfaces of the said gate intersect each other in a gate edge, wherein the said gate edge is in contact with a dielectric material in at least two points, wherein the said gate surfaces form an internal gate angle of less than 88 degrees, wherein a floating gate is implemented in an area between a control gate and the said channel region.

FIG. 1.*e* shows a prior art wherein a typical planar memory cell with a floating gate is depicted. Here, 1 is a control gate, 2 and 4 are dielectric layers, 3 is a floating gate, 5 is an n+ source region, 6 is an n+ drain region and 7 is a p-type channel region. This figure depicts a memory cell having a non-insulating channel region 7, said memory cell has a gate 1 which is not in physical contact with channel region 7, wherein at least one dielectric material (2 or 4) is implemented in an area between the said gate 1 and the said channel region 7, wherein non of gate surfaces that intersect each other in a gate edge which is in contact with a dielectric material 2 in at least two points form an internal gate angle of less than 88 degrees.

Figure 2:
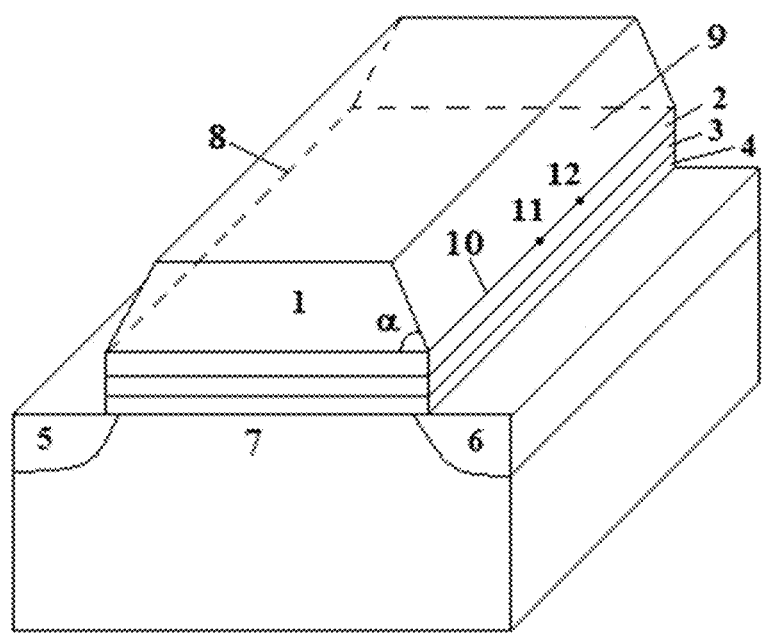
FIG. 2 shows an example embodiment of implementation of the invention in a planar memory cell with a floating gate.

FIG. 2 shows an example embodiment of implementation of the invention in a planar memory cell with a floating gate. Here, 1 is a control gate, 2 and 4 are dielectric layers, 3 is a floating gate, 5 is an n+ source region, 6 is an n+ drain region, 7 is a p-type channel region, 8 is a surface of the control gate 1 at the interface of the control gate 1 and oxide 2, 9 is a surface of the control gate 1 and 10 is an edge of the control gate 1. This figure depicts a memory cell having a non-insulating channel region 7, said memory cell has a gate 1 which is not in physical contact with the said channel region 7, wherein at least one dielectric material (2 or 4) is implemented in an area between the said gate and the said channel region, wherein at least two surfaces of the said gate (8 and 9) intersect each other in a gate edge 10, wherein the said gate edge is in contact with a dielectric material 2 in at least two points (11 and 12), wherein the said gate surfaces form an internal gate angle $\alpha$ of less than 88 degrees, wherein a floating gate 4 is implemented in an area between a control gate 1 and the said channel region 7.

Another example embodiment of this invention is a device having a Fin, wherein the said Fin is made of at least one non-insulating material, wherein the said Fin is on a material region, wherein the interface between the said Fin and the said material region is just one flat surface, said device has a gate which is not in physical contact with the said Fin, wherein at least two surfaces of the said gate intersect each other in a gate edge, wherein the said gate edge is in contact with a dielectric material in at least two points, wherein the said gate surfaces form an internal gate angle of less than 88 degrees. In some example embodiments, the said device is a FinFET. In other example embodiments, the said device is a memory cell. In the example embodiments where the said device is a memory cell, a dielectric charge trapping structure or a floating gate may be implemented in an area between a control gate and the said Fin.

Figure 3:
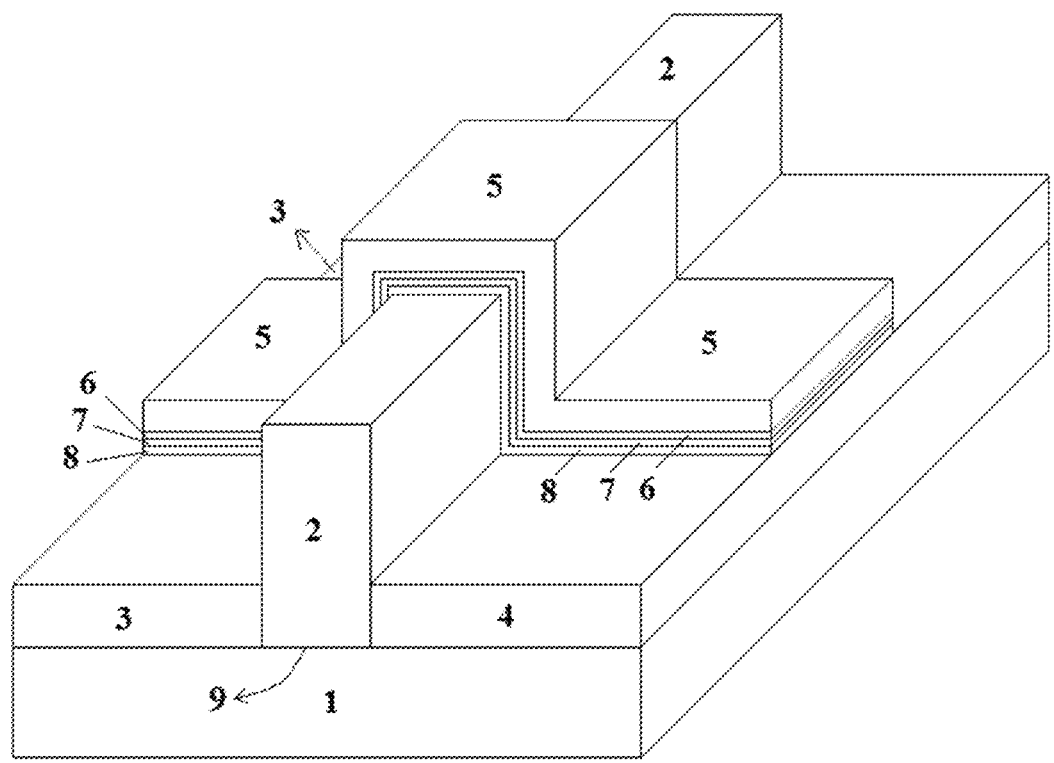
FIG. 3 shows a prior art wherein a tri-gate memory cell with Oxide/Nitride/Oxide charge trapping structure is depicted.

FIG. 3 shows a prior art wherein a tri-gate memory cell with Oxide/Nitride/Oxide charge trapping structure is depicted. Here, 1 is a substrate, 2 is a semiconductor Fin, 3 and 4 are insulators, 5 is a gate, 6 and 8 are oxide layers and 7 is a nitride charge trapping layer. In an example embodiment, the portions of the Fin 2 which are not underneath the gate 5 can be n+ doped where one side can act as a source region and the other side can act as a drain region. This figure depicts a memory cell having a Fin 2, wherein the said Fin is made of at least one non-insulating material, wherein the said Fin 2 is on a material region 1, wherein the interface between the said Fin 2 and the said material region 1 is just one flat surface 9, said device has a gate 5 which is not in physical contact with the said Fin 2, wherein non of gate surfaces that intersect each other in a gate edge which is in contact with a dielectric material in at least two points form an internal gate angle of less than 88 degrees.

Figure 4:
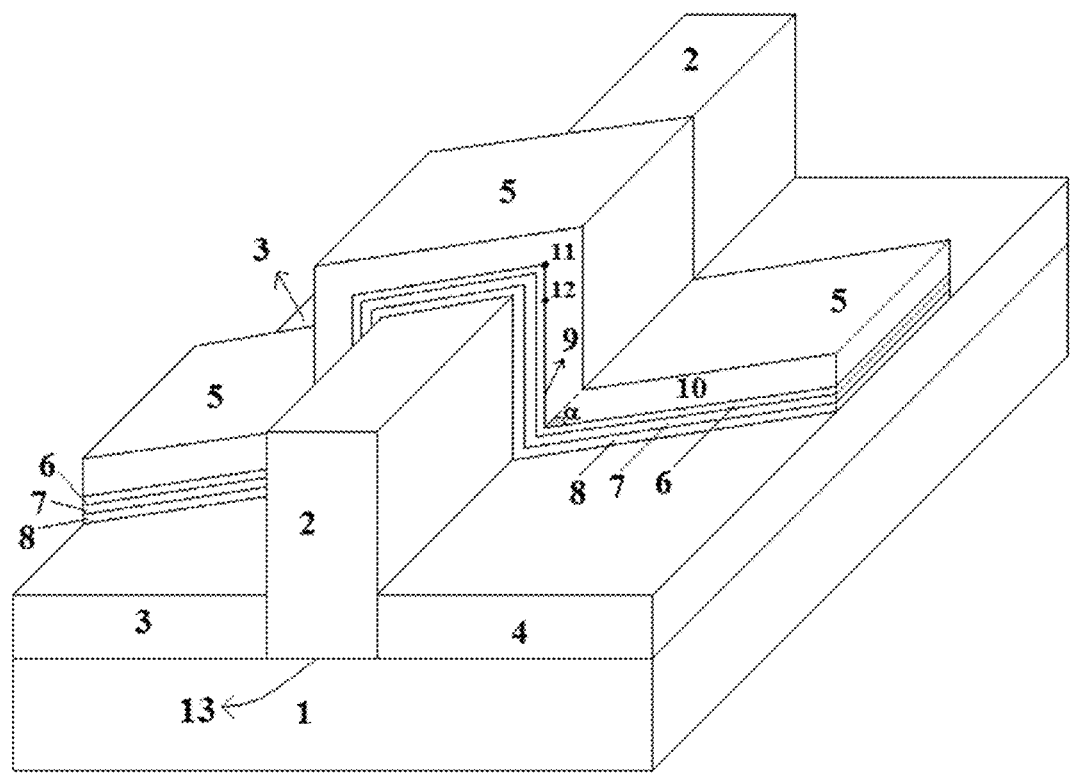
FIG. 4 shows an example embodiment of implementation of the invention in a memory cell having a Fin.

FIG. 4 shows an example embodiment of implementation of the invention in a memory cell having a Fin. Here, 1 is a substrate, 2 is a semiconductor Fin, 3 and 4 are insulators, 5 is a gate, 6 and 8 are oxide layers, 7 is a nitride charge trapping layer, 9 is a gate surface which is at the interface of the gate 5 and the oxide 6, and 10 is a sidewall surface of the gate 5. This figure depicts a memory cell having a Fin 2, wherein the said Fin is made of at least one non-insulating material, wherein the said Fin 2 is on a material region 1, wherein the interface between the said Fin 2 and the said material region 1 is just one flat surface 13, said device has a gate 5 which is not in physical contact with the said Fin 2, wherein at least two surfaces of the said gate (9 and 10) intersect each other in a gate edge, wherein the said gate edge is in contact with a dielectric material 6 in at least two points (11 and 12), wherein the said gate surfaces form an internal gate angle α of less than 88 degrees. In an example embodiment, the portions of the Fin which are not underneath the gate can be n+ doped where one side can act as a source region and the other side can act as a drain region. In another example embodiment of the invention, instead of the Oxide/Nitride/Oxide layers (6, 7 and 8), a gate dielectric may be implemented and the device will be a FinFET or a tri-gate transistor. In other example embodiments, instead of the nitride layer 7, a floating gate (which may be made of polysilicon) may be implemented.

Figure 5:
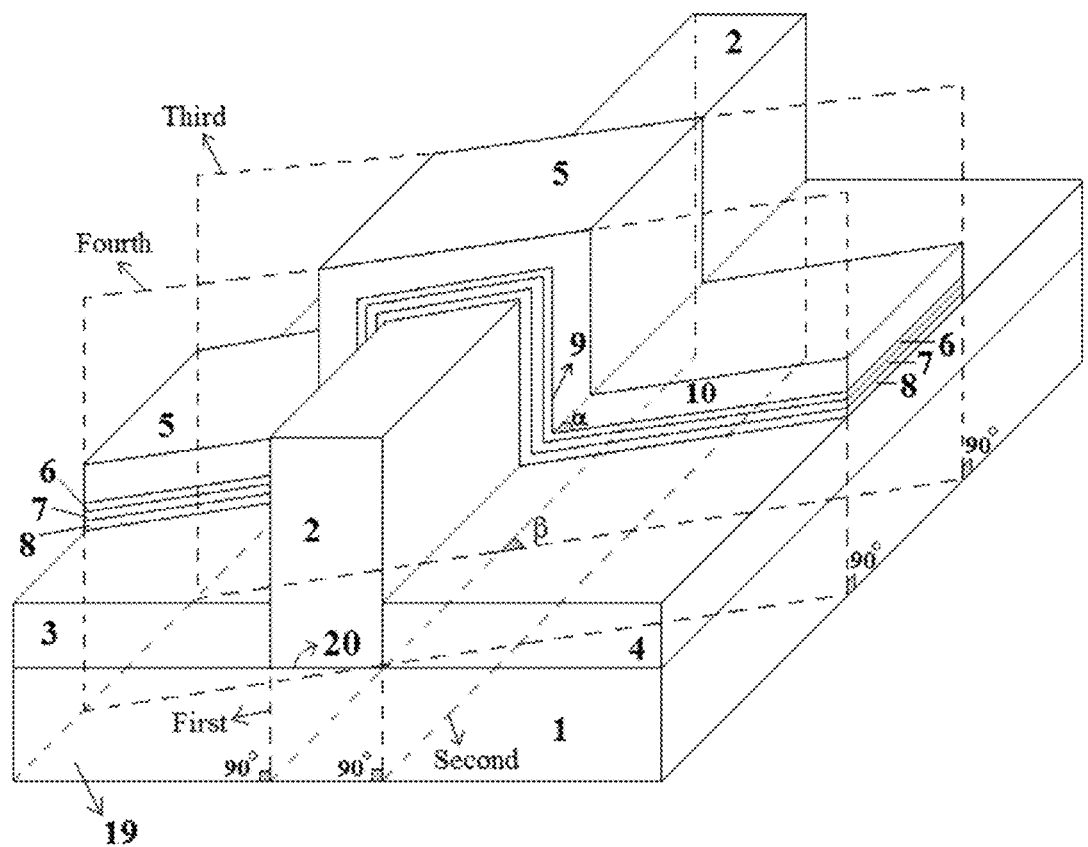
FIG. 5 shows an example embodiment of implementation of the invention in a tri-gate memory cell.

FIG. 5 shows an example embodiment of implementation of the invention in a tri-gate memory cell. Here, 1 is a substrate, 2 is a semiconductor Fin which is on a material region 1, wherein the interface between the said Fin 2 and the said material region 1 is just one flat surface 20, 3 and 4 are insulators, 5 is a gate, 6 and 8 are oxide layers, 7 is a nitride charge trapping layer, 9 is a surface of the gate 5 which is at the interface of the gate 5 and oxide 6, and 10 is a sidewall surface of the gate 5. In this figure, a first and a second plane can be drawn perpendicular to a device substrate plane 19, wherein the said first and second planes are parallel with respect to each other, wherein each of the said first and second planes are tangent to a sidewall surface of the Fin 2, wherein the said Fin 2 completely lies in between the said first and second planes, wherein a third and a fourth plane are drawn perpendicular to the said device substrate plane 19, wherein the said third and fourth planes are parallel with respect to each other, wherein each of the said third and fourth planes are tangent to a sidewall surface of the gate 5, wherein the said gate completely lies in between the said third and fourth planes, wherein the said first and third planes have an angle β of less than 88 degrees. In FIG. 5, α=β.

A method may be used to fabricate the device shown in FIG. 5, wherein a lithography gate mask is used to form the said gate 5, wherein a lithography Fin mask is used to form the said Fin 2, wherein an edge of an opening in the said Fin mask defines a sidewall of the said Fin, wherein an edge of an opening in the said gate mask defines a sidewall of the said gate, wherein the said edge of the opening in the said gate mask is positioned at an angle of less than 88 degrees relative to the position of the said edge of the opening in the said Fin mask in a lithography mask alignment process.

Figure 6:
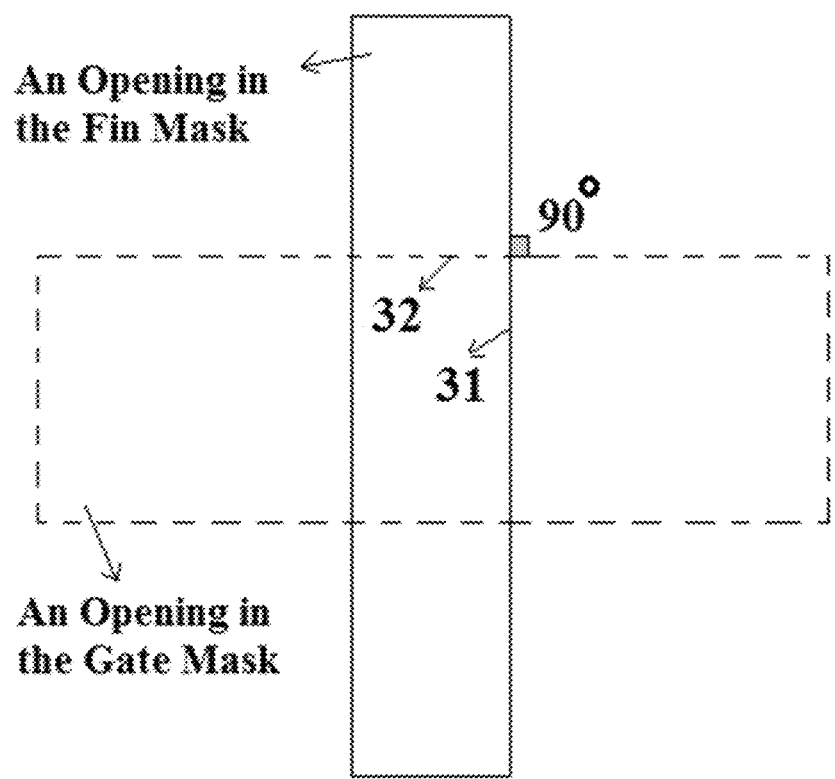
FIG. 6 shows relative positions of a gate and a Fin mask during a lithography mask alignment process in a conventional method to fabricate the device shown in FIG. 3.

FIG. 6 shows relative positions of a gate and a Fin mask during a lithography mask alignment process in a conventional method to fabricate the device shown in FIG. 3. In this method, a lithography gate mask is used to form the gate 5 of FIG. 3, a lithography Fin mask is used to form the Fin 2 of FIG. 3, wherein an edge 31 of an opening in the said Fin mask defines a sidewall of the said Fin, wherein an edge 32 of an opening in the said gate mask defines a sidewall of the said gate, wherein the said edge of the opening in the said gate mask is positioned at an angle of 90 degrees relative to the position of the said edge of the opening in the said Fin mask in a lithography mask alignment process. In FIG. 6, the said opening in the Fin mask is shown by the solid lines and the said opening of the gate mask is shown by dashed lines.

Figure 7:
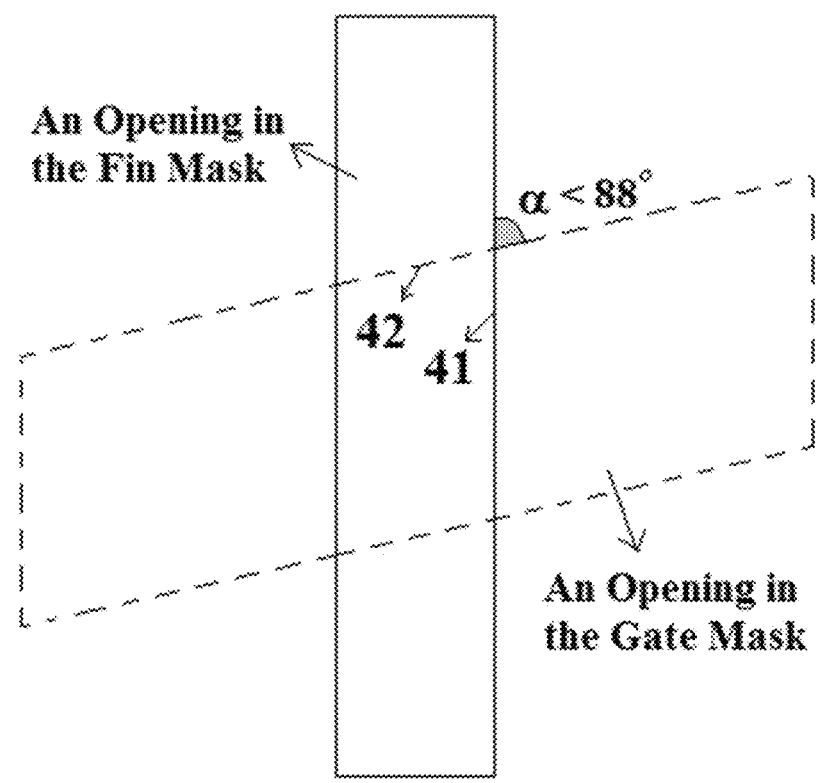
FIG. 7 shows relative positions of a gate and a Fin mask during a lithography mask alignment process in a method to fabricate the device shown in FIG. 4.

FIG. 7 shows relative positions of a gate and a Fin mask during a lithography mask alignment process in a method to fabricate the device shown in FIG. 4. In this method, a lithography gate mask is used to form the said gate 5 of FIG. 4, wherein a lithography Fin mask is used to form the said Fin 2 of FIG. 4, wherein an edge 41 of an opening in the said Fin mask defines a sidewall of the said Fin 2 of FIG. 4, wherein an edge 42 of an opening in the said gate mask defines a sidewall of the said gate 5 of FIG. 4, wherein the said edge of the opening in the said gate mask is positioned at an angle α of less than 88 degrees relative to the position of the said edge of the opening in the said Fin mask in a lithography mask alignment process. In FIG. 7, the said opening in the Fin mask is shown by the solid lines and the said opening of the gate mask is shown by dashed lines.

Figure 8:
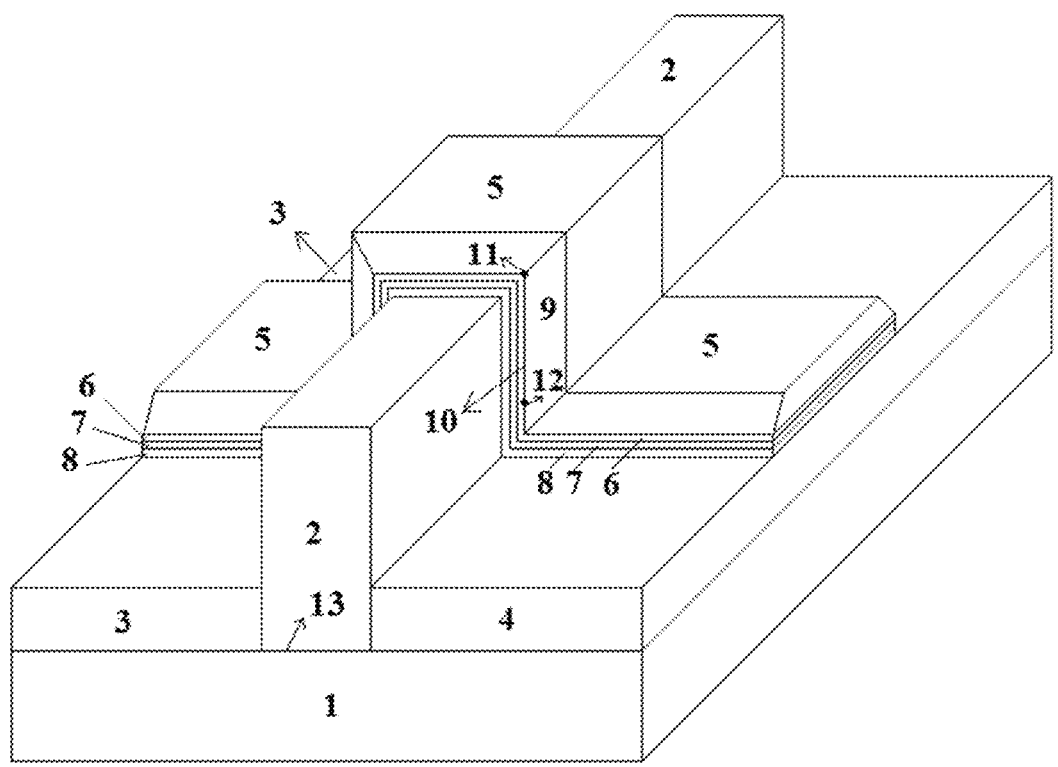
FIG. 8 shows an example embodiment of implementation of the invention in a memory cell having a Fin.

FIG. 8 shows an example embodiment of implementation of the invention in a memory cell having a Fin. Here, 1 is a substrate, 2 is a semiconductor Fin, 3 and 4 are insulators, 5 is a gate, 6 and 8 are oxide layers, 7 is a nitride charge trapping layer, 9 is a surface of the gate 5 and 10 is a surface of the gate 5 which is at the interface of the gate 5 and oxide 6. This figure depicts a memory cell having a Fin 2, wherein the said Fin is made of at least one non-insulating material, wherein the said Fin 2 is on a material region 1, wherein the interface between the said Fin 2 and the said material region 1 is just one flat surface 13, said device has a gate 5 which is not in physical contact with the said Fin 2, wherein at least two surfaces (9 and 10) of the said gate 5 intersect each other in a gate edge, wherein the said gate edge is in contact with a dielectric material 6 in at least two points (11 and 12), wherein the said gate surfaces form an internal gate angle of less than 88 degrees. In an example embodiment of the invention, instead of the Oxide/Nitride/Oxide layers (6, 7 and 8), a gate dielectric may be implemented and the device will be a FinFET or a tri-gate transistor. In other example embodiments, High-K dielectric materials may be implemented instead of layers 6, 7 and 8. In other example embodiments, a floating gate may be implemented instead of the nitride layer 7.

This invention can also be applied to a 3D memory cell having a non-insulating channel region wherein the said 3D memory cell has a gate which is not in physical contact with the said channel region, wherein the said gate is all around the said channel region, wherein at least one dielectric material is implemented in an area between the said gate and the said channel region, wherein at least two surfaces of the said gate intersect each other in a gate edge, wherein the said gate edge is in contact with a dielectric material in at least two points, wherein the said gate surfaces form an internal gate angle of less than 88 degrees.

Figure 9:
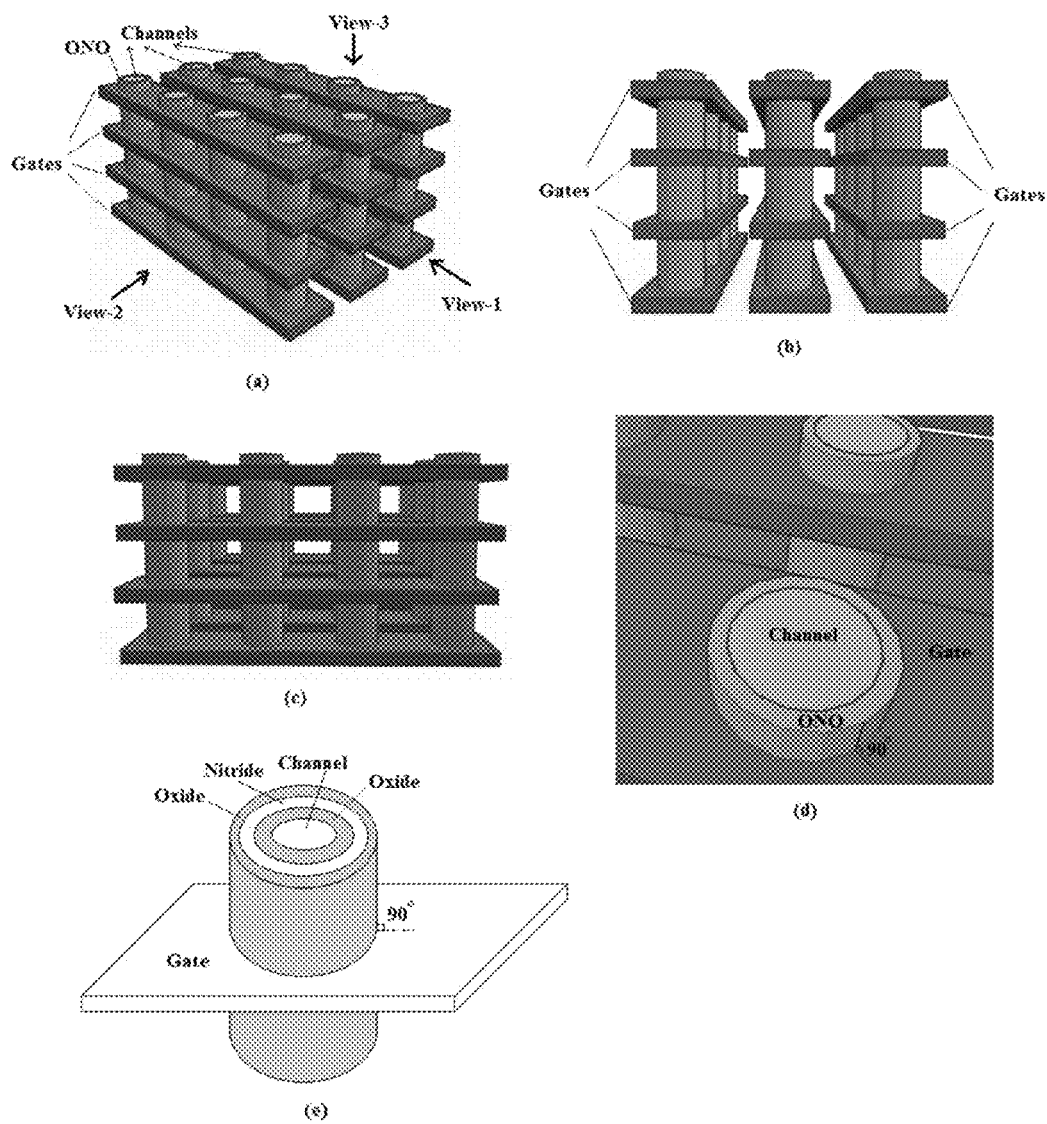
FIG. 9 shows a prior art where it depicts a part of a vertical channel 3D NAND flash memory structure in which 3D memory cells are implemented in a 3D array of memory cells.

FIG. 9.a shows a prior art where it depicts a part of a vertical channel 3D NAND flash memory structure in which 3D memory cells are implemented in a 3D array of memory cells. The entire structure of the said vertical channel 3D NAND flash memory is not shown here for the sake of simplicity. Forty eight 3D memory cells are implemented in this structure as shown in FIG. 9.a. Each of the said 48 cells comprises of a channel which is made of a non-insulating material such as crystalline silicon or poly silicon or combinations of layers of materials. For each of the said 48 cells, an Oxide-Nitride-Oxide (ONO) stack is implemented in between a channel and a gate wherein the said nitride layer acts as a charge trapping layer, wherein the said nitride layer is sandwiched in between the said two oxide layers, wherein the said gate is all around the said channel. FIG. 9.*b* shows a view of FIG. 9.*a* from View-1 side, FIG. 9.*c* shows a view of FIG. 9.*a* from View-2 side and FIG. 9.*d* depicts a zoomed-in view of FIG. 9.*a* from View-3 side. FIG. 9.*e* shows a more detailed schematic of each of the said 48 cells. In this structure, for each of the said 48 cells, all surfaces of its corresponding gate that intersect each other in a gate edge that is in contact with a dielectric material in at least two points, form an internal gate angle of larger than 88 degrees.

Figure 10:
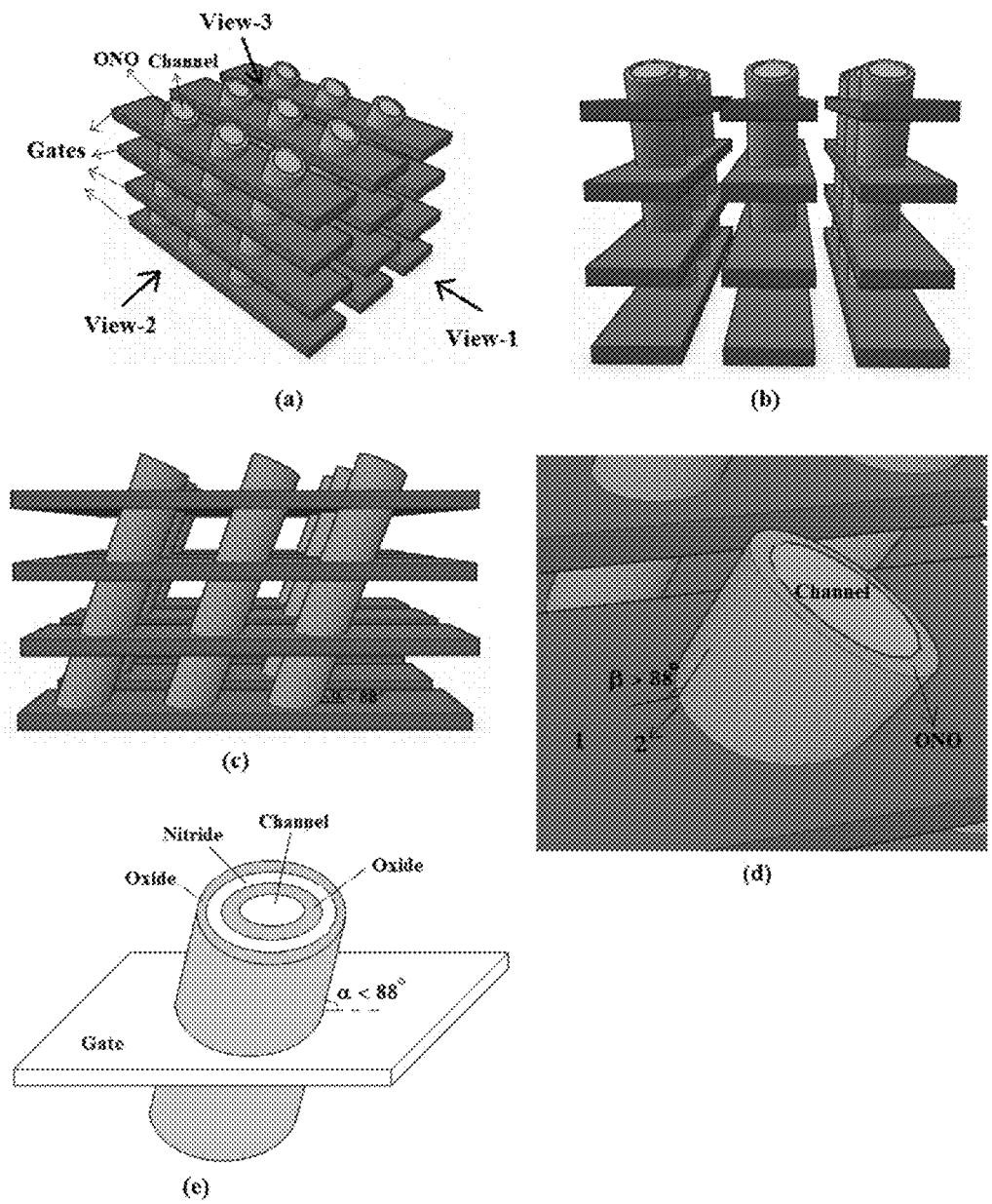
FIG. 10 shows an example embodiment of implementation of the invention in a 3D memory cell implemented in a 3D array of memory cells where it depicts a part of an array of 3D NAND flash memory structure.

FIG. 10 shows an example embodiment of implementation of the invention in a 3D memory cell implemented in a 3D array of memory cells where it depicts a part of an array of 3D NAND flash memory structure. The entire structure of 3D NAND flash memory is not shown here for the sake of simplicity. Thirty six 3D memory cells are implemented in this structure as shown in FIG. 10.*a*. Each of the said 36 cells comprises of a channel which is made of a non-insulating material such as crystalline silicon or poly silicon or combinations of layers of materials. For each of the said 36 cells, an Oxide-Nitride-Oxide (ONO) stack is implemented in between a channel and a gate, wherein the said nitride layer acts as a charge trapping layer, wherein the said nitride layer is sandwiched in between the said two oxide layers, wherein the said gate is all around the said channel. FIG. 10.*b* shows a view of FIG. 10.*a* from View-1 side, FIG. 10.*c* shows a view of FIG. 10.*a* from View-2 side and FIG. 10.*d* depicts a zoomed-in view of FIG. 10.*a* from View-3 side. FIG. 10.*e* shows a more detailed schematic of each of the said 36 cells. 2 is a surface of a gate which is at the interface of a gate and an outer oxide layer of an ONO stack, and 1 is another surface of the same gate having the surface 2. Here, at least two surfaces (1 and 2) of a gate intersect each other in a gate edge, wherein the said gate edge is in contact with a dielectric material (the outer oxide layer of ONO) in at least two points, wherein the said surfaces form an internal gate angle of less than 88 degrees. In other example embodiments, a high-k dielectric material may be implemented between the shown gates and the outer oxide layers of ONOs. In some example embodiments, instead of the shown nitride layers, floating gates may be implemented.

Figure 11:
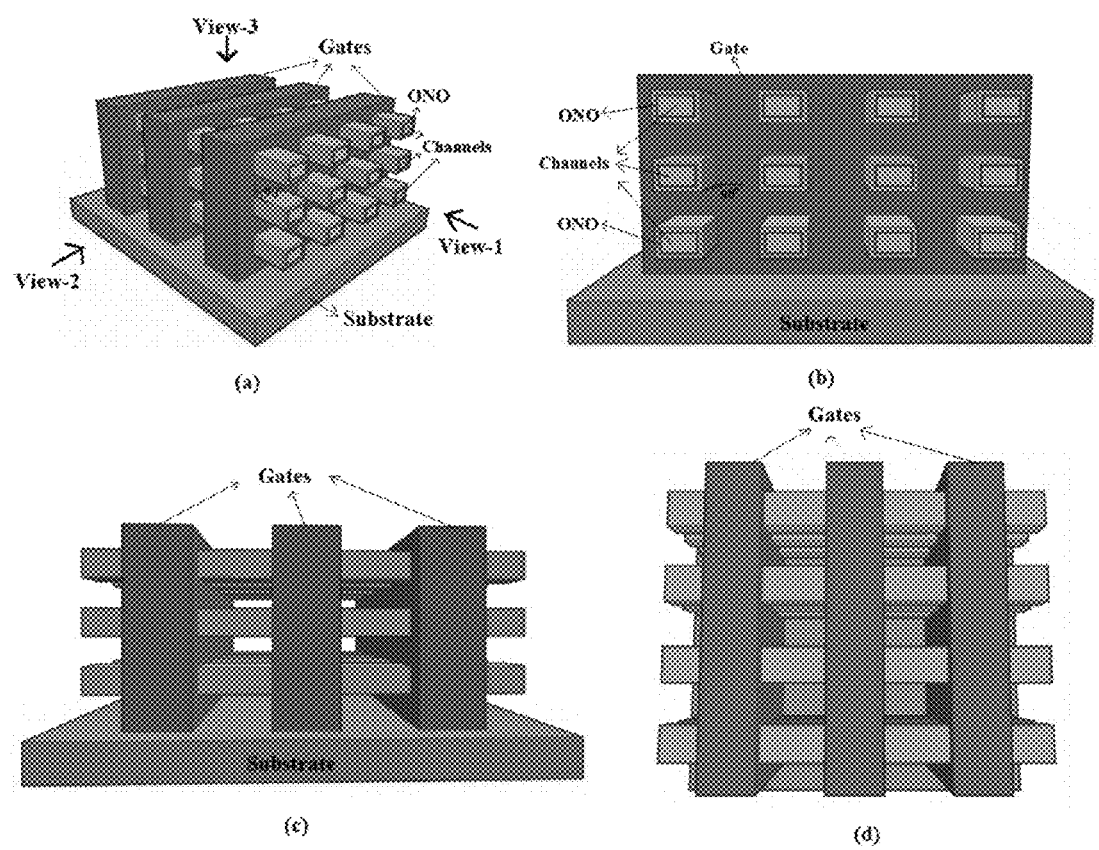
FIG. 11 shows a prior art where it depicts a part of a vertical gate 3D NAND flash memory in which 3D memory cells are implemented in a 3D array of memory cells.

FIG. 11.*a* shows a prior art where it depicts a part of a vertical gate 3D NAND flash memory in which 3D memory cells are implemented in a 3D array of memory cells. The entire structure of 3D NAND flash memory is not shown here for the sake of simplicity. Thirty six 3D memory cells are implemented in this structure as shown in FIG. 11.*a*. Each of the said 36 cells comprises of a channel which is made of a non-insulating material such as crystalline silicon or poly silicon or combinations of layers of materials. For each of the said 36 cells, an Oxide-Nitride-Oxide (ONO) stack is implemented in between a channel and a gate, wherein the said nitride layer acts as a charge trapping layer, wherein the said nitride layer is sandwiched in between the said two oxide layers, wherein the said gate is all around the said channel. FIG. 11.*b* shows a view of FIG. 11.*a* from View-1 side, FIG. 11.*c* shows a view of FIG. 11.*a* from View-2 side and FIG. 11.*d* depicts a zoomed-in view of FIG. 11.*a* from View-3 side. For each of the said 36 cells, all gate surfaces that intersect each other in a gate edge that is in contact with a dielectric material in at least two points, form an internal gate angles of larger than 88 degrees.

Figure 12:
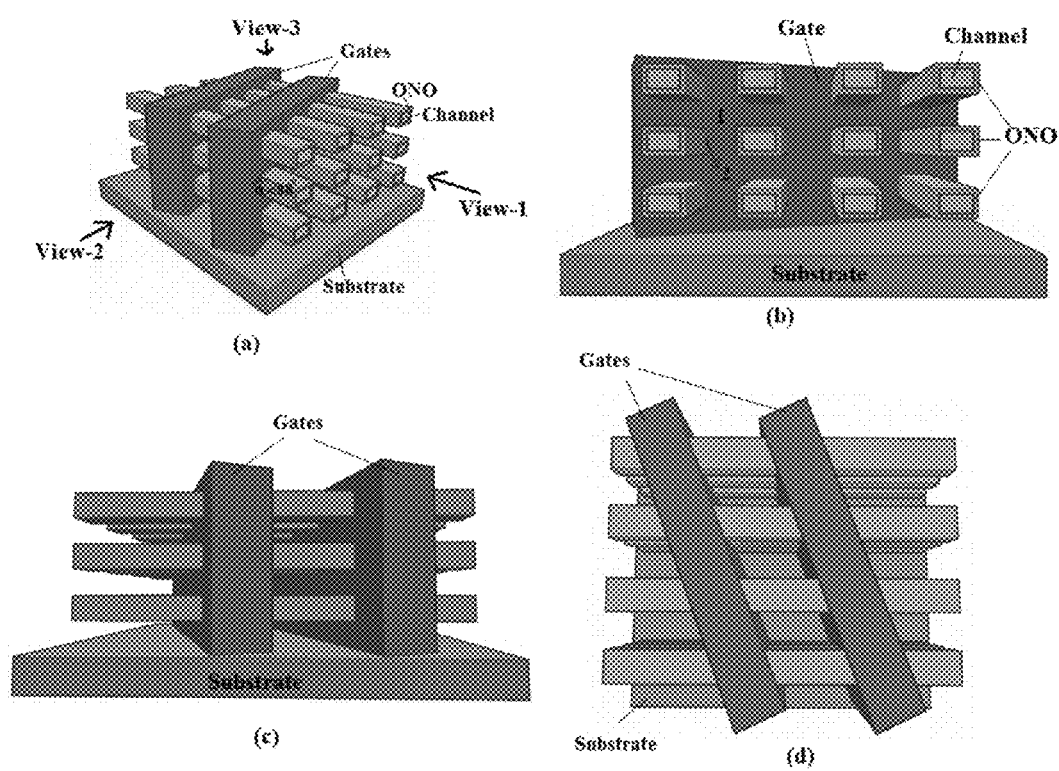
FIG. 12 shows an example embodiment of implementation of the invention in a 3D memory cell implemented in a 3D array of memory cells where it depicts a part of an array of 3D NAND flash memory structure.

FIG. 12 shows an example embodiment of implementation of the invention in a 3D memory cell implemented in a 3D array of memory cells where it depicts a part of an array of 3D NAND flash memory structure. The entire structure of 3D NAND flash memory is not shown here for the sake of simplicity. Twenty four 3D memory cells are implemented in this structure as shown in FIG. 12.*a*. Each of the said twenty four cells comprises of a channel which is made of a non-insulating material such as crystalline silicon or poly silicon. For each of the said 24 cells, an Oxide-Nitride-Oxide (ONO) stack is implemented in between a channel and a gate, wherein the said nitride layer acts as a charge trapping layer, wherein the said nitride layer is sandwiched in between the said two oxide layers, wherein the said gate is all around the said channel. FIG. 12.*b* shows a view of FIG. 12.*a* from View-1 side, FIG. 12.*c* shows a view of FIG. 12.*a* from View-2 side and FIG. 12.*d* depicts a zoomed-in view of FIG. 12.*a* from View-3 side. 2 is a surface of a gate which is at the interface of a gate and an outer oxide layer of an ONO stack and 1 is another surface of the gate having surface 2. Here, at least two surfaces (1 and 2) of a gate intersect each other in a gate edge, wherein the said gate edge is in contact with a dielectric material (the outer oxide layer of ONO) in at least two points, wherein the said gate surfaces form an internal gate angle of less than 88 degrees. In other example embodiments, a high-k dielectric material may be implemented between the shown gates and the outer oxide layers of the shown ONOs.

Figure 13:
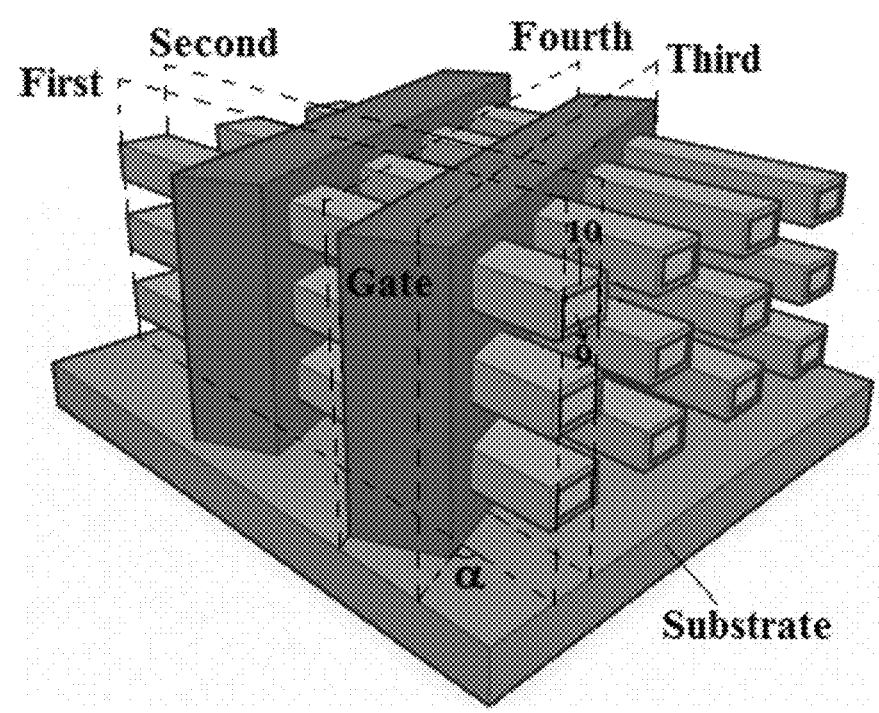
FIG. 13 shows an example embodiment of implementation of the invention where it depicts a part of an array of 3D NAND flash memory structure.

FIG. 13 shows an example embodiment of the implementation of the invention where it depicts a part of an array of 3D NAND flash memory structure. In this structure, a first and a second plane are drawn perpendicular to the device substrate, wherein the said first and second planes are parallel with respect to each other, wherein each of the said first and second planes are tangent to a sidewall surface of channel 9, wherein the said channel 9 completely lies in between the said first and second planes, wherein a third and a fourth plane are drawn perpendicular to the device substrate, wherein the said third and fourth planes are parallel with respect to each other, wherein each of the said third and fourth planes are tangent to a sidewall surface of a gate, wherein the said gate completely lies in between the said third and fourth planes, wherein the said first and third planes have an angle $\alpha$ of less than 88 degrees. In this figure, 10 is an ONO.

Figure 14:
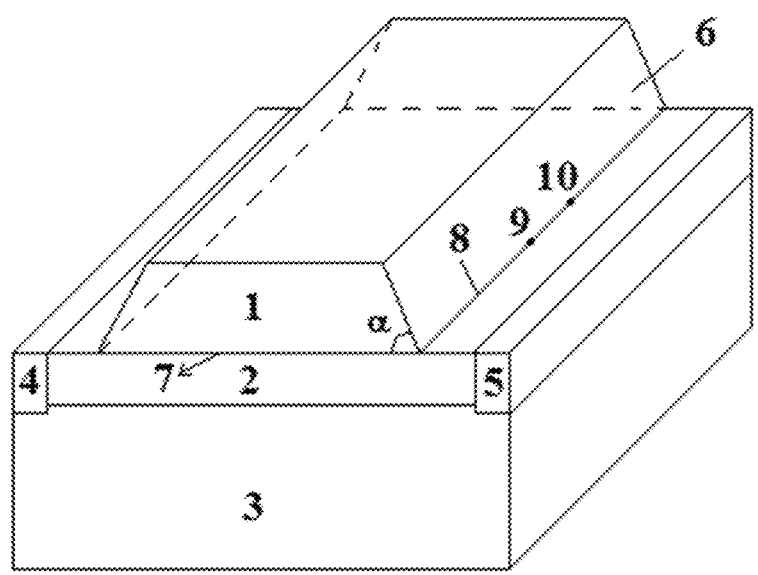
FIG. 14 shows an example embodiment of implementation of invention in an AlGaN/GaN High Electron Mobility Transistor.

This invention can also be implemented in a High Electron Mobility Transistor with a gate, wherein the said transistor has a compound semiconductor material region. In this case, at least two surfaces of the said gate intersect each other in a gate edge, wherein the said gate edge is in contact with a dielectric or a compound semiconductor material in at least two points, wherein the said surfaces of the said gate form an internal gate angle of less than 88 degrees. FIG. 14 shows an example embodiment of implementation of the invention in an AlGaN/GaN High Electron Mobility Transistor (HEMT). In this figure, 1 is a gate, 2 is AlGaN, 3 is GaN, 4 is a source contact, 5 is a drain contact, 6 is a surface of gate 1, 7 is a surface of gate 1 which is at the interface of the said gate 1 and AlGaN 2, and 8 is a gate edge. This figure shows a High Electron Mobility Transistor with a gate 1, wherein the said transistor has a compound semiconductor material region (2 or 3). In this device, at least two surfaces (6 and 7) of the said gate intersect each other in a gate edge 8, wherein the said gate edge is in contact with a dielectric or a compound semiconductor material 2 in at least two points (9 and 10), wherein the said gate surfaces form an internal gate angle $\alpha$ of less than 88 degrees. In another example embodiment, 2 is AlGaAs and 3 is GaAs. In another example embodiment, a gate dielectric may be implemented in between the gate 1 and region 2.

The invention claimed is:

1. A device having a Fin, wherein the said Fin is made of at least one non-insulating material, wherein the said Fin is on a material region, wherein the interface between the said Fin and the said material region is just one flat surface, said device has a gate which is not in physical contact with the said Fin, wherein at least two surfaces of the said gate intersect each other in a gate edge, wherein the said gate edge is in contact with a dielectric material in at least two points, wherein the said gate surfaces form an internal gate angle of less than 88 degrees.

2. The device of claim 1, wherein the said device is a FinFET.

3. The device of claim 1, wherein the said device is a memory cell.

4. The memory cell of claim 3, wherein the said gate is a control gate, wherein a floating gate is implemented in an area between the said control gate and the said Fin.

5. The memory cell of claim 3, wherein the said gate is a floating gate, wherein the said floating gate is implemented in an area between a control gate and the said Fin.

6. The memory cell of claim 3, wherein a dielectric charge trapping structure is implemented in an area between the said gate and the said Fin.

7. The memory cell of claim 6, wherein a charge trapping layer is implemented between two dielectric layers in an area between the said gate and the said Fin.

8. The memory cell of claim 6, wherein an Oxide/Nitride/Oxide (ONO) stack is implemented in an area between the said gate and the said Fin, wherein the said nitride layer acts as a charge trapping layer.

9. A method to fabricate the device of claim 1, wherein a lithography gate mask is used to form the said gate, wherein a lithography Fin mask is used to form the said Fin, wherein an edge of an opening in the said Fin mask defines a sidewall of the said Fin, wherein an edge of an opening in the said gate mask defines a sidewall of the said gate, wherein the said edge of the opening in the said mask is positioned at an angle of less than 88 degrees relative to the position of the said edge of the opening in the said Fin mask in a lithography mask alignment process.

10. A 3D memory cell having a non-insulating channel region, said 3D memory cell has a gate which is not in physical contact with the said channel region, wherein the said gate is all around the said channel region, wherein at least one dielectric material is implemented in an area between the said gate and the said channel region, wherein at least two surfaces of the said gate intersect each other in a gate edge, wherein the said gate edge is in contact with a dielectric material in at least two points, wherein the said gate surfaces form an internal gate angle of less than 88 degrees.

11. The 3D memory cell of claim 10, wherein the said gate is a control gate, wherein a floating gate is implemented in an area between the said control gate and the said channel region.

12. The 3D memory cell of claim 10, wherein the said gate is a floating gate, wherein the said floating gate is implemented in an area between a control gate and the said channel region.

13. The 3D memory cell of claim 10, wherein the said cell is implemented in a 3D array of memory cells in a 3D NAND flash memory structure.

14. A method to fabricate the 3D memory cell implemented in the 3D NAND flash memory structure of claim 13, wherein a lithography gate mask is used to form the said gate, wherein another lithography mask is used to form the said channel region, wherein an edge of an opening in the said mask used to form the said channel region defines a sidewall of the said channel region, wherein an edge of an opening in the said gate mask defines a sidewall of the said gate, wherein the said edge of the opening in the said gate mask is positioned at an angle of less than 88 degrees relative to the position of the said edge of the opening in the said mask used to form the said channel region during a lithography mask alignment process.

15. The 3D memory cell of claim 10, wherein a dielectric charge trapping structure is implemented in an area between the said gate and the said channel region.

16. The memory cell of claim 15, wherein a charge trapping layer is implemented between two dielectric layers in an area between the said gate and the said channel region.

17. The memory cell of claim 15, wherein an Oxide/Nitride/Oxide (ONO) stack is implemented in an area between the said gate and the said channel region, wherein the said nitride layer acts as a charge trapping layer.

18. A memory cell having a non-insulating channel region, said memory cell has a gate which is not in physical contact with the said channel region, wherein at least one dielectric material is implemented in an area between the said gate and the said channel region, wherein at least two surfaces of the said gate intersect each other in a gate edge, wherein the said gate edge is in contact with a dielectric material in at least two points, wherein the said gate surfaces form an internal gate angle of less than 88 degrees, wherein a floating gate is implemented in an area between a control gate and the said channel region.

19. The memory cell of claim 18, wherein the said gate which is not in physical contact with the said channel region, is the said floating gate.

20. A High Electron Mobility Transistor with a gate, wherein the said transistor has a compound semiconductor material region, wherein at least two surfaces of the said gate intersect each other in a gate edge, wherein the said gate edge is in contact with a dielectric or the said compound semiconductor material region in at least two points, wherein the said gate surfaces form an internal gate angle of less than 88 degrees.

21. A planar memory cell having a non-insulating channel region, said memory cell has a gate which is not in physical contact with the said channel region, wherein at least one dielectric material is implemented in an area between the said gate and the said channel region, wherein at least two surfaces of the said gate intersect each other in a gate edge, wherein the said gate edge is in contact with a dielectric material in at least two points, wherein the said gate surfaces form an internal gate angle of less than 88 degrees, wherein a dielectric charge trapping structure is implemented in an area between a control gate and the said channel region.

* * * * *